United States Patent
Lee et al.

(10) Patent No.: US 10,881,004 B1
(45) Date of Patent: Dec. 29, 2020

(54) ELECTRONIC COMPONENT EMBEDDED SUBSTRATE

(71) Applicant: SAMSUNG ELECTRO-MECHANICS CO., LTD., Suwon-si (KR)

(72) Inventors: Seung Eun Lee, Suwon-si (KR); Yong Hoon Kim, Suwon-si (KR); Kyung Hwan Ko, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/812,972

(22) Filed: Mar. 9, 2020

(30) Foreign Application Priority Data

Dec. 16, 2019 (KR) .......................... 10-2019-0167951

(51) Int. Cl.
| | |
|---|---|
| *H05K 1/18* | (2006.01) |
| *H01L 23/498* | (2006.01) |
| *H01L 23/64* | (2006.01) |
| *H05K 1/11* | (2006.01) |
| *H05K 1/09* | (2006.01) |
| *H05K 1/03* | (2006.01) |

(52) U.S. Cl.
CPC ....... *H05K 1/185* (2013.01); *H01L 23/49822* (2013.01); *H01L 23/49827* (2013.01); *H01L 23/642* (2013.01); *H05K 1/0353* (2013.01); *H05K 1/092* (2013.01); *H05K 1/115* (2013.01); *H05K 2201/09827* (2013.01); *H05K 2201/10015* (2013.01)

(58) Field of Classification Search
CPC .......... H05K 1/182–185; H05K 1/115; H05K 2201/09827; H05K 2201/10015; H01L 23/49822; H01L 23/49827; H01L 23/642
See application file for complete search history.

(56) References Cited

U.S. PATENT DOCUMENTS

| | | | |
|---|---|---|---|
| 2007/0035015 A1* | 2/2007 | Hsu ..................... | H01L 23/5389 257/723 |
| 2012/0236508 A1 | 9/2012 | Arai | |
| 2013/0037950 A1* | 2/2013 | Yu ....................... | H01L 23/3121 257/738 |
| 2013/0105943 A1* | 5/2013 | Lai ..................... | H01L 23/49822 257/532 |

(Continued)

FOREIGN PATENT DOCUMENTS

| | | |
|---|---|---|
| JP | 5229401 B2 | 7/2013 |
| KR | 10-2010-0080633 A | 7/2010 |
| KR | 10-1155624 B1 | 6/2012 |

*Primary Examiner* — Hoa C Nguyen
(74) *Attorney, Agent, or Firm* — Morgan, Lewis & Bockius LLP

(57) ABSTRACT

An electronic component embedded substrate includes a first electronic component; a first insulating material covering at least a portion of the first electronic component; a first wiring layer disposed on one surface of the first insulating material; a second electronic component disposed on the first wiring layer and connected to the first electronic component by the first wiring layer; and a second insulating material covering at least a portion of the second electronic component, wherein the at least a portion of the first electronic component is exposed from the other surface of the first insulating material, opposite to the one surface of the first insulating material.

20 Claims, 16 Drawing Sheets

(56) References Cited

U.S. PATENT DOCUMENTS

| | | | |
|---|---|---|---|
| 2014/0144676 A1* | 5/2014 | Chung | H05K 1/186 |
| | | | 174/251 |
| 2017/0231094 A1* | 8/2017 | Blackshear | H05K 1/185 |
| 2019/0306988 A1* | 10/2019 | Grober | H01L 25/50 |

* cited by examiner

US 10,881,004 B1

ELECTRONIC COMPONENT EMBEDDED SUBSTRATE

CROSS-REFERENCE TO RELATED APPLICATION

This application claims benefit of priority to Korean Patent Application No. 10-2019-0167951 filed on Dec. 16, 2019 in the Korean Intellectual Property Office, the disclosure of which is incorporated herein by reference in its entirety.

TECHNICAL FIELD

The present disclosure relates to an electronic component embedded substrate.

BACKGROUND

Recently, an electronic device is required to have relatively high performance and relatively high functionality, while being thinned and miniaturized. Accordingly, the number of electronic components to be mounted on a printed circuit board is increasing, but the number of electronic components capable of being mounted on a surface of the printed circuit board is limited. This is because a size of the printed circuit board is also required to be decreased, according to the miniaturization and thinning of the electronic device. Accordingly, a technology for electronic component embedded substrates embedding electronic components such as passive components and active components in the printed circuit board has been developed.

SUMMARY

An aspect of the present disclosure is to provide an electronic component embedded substrate having shortened electrical connection paths.

Another aspect of the present disclosure is to provide an electronic component embedded substrate having improved power integrity (PI) characteristics due to an increase in capacitance of an electronic component and/or a decrease in equivalent series inductance (ESL) of the electronic component.

Another aspect of the present disclosure is to provide an electronic component embedded substrate having improved warpage characteristics.

According to an aspect of the present disclosure, an electronic component embedded substrate includes a first electronic component; a first insulating material covering at least a portion of the first electronic component; a first wiring layer disposed on one surface of the first insulating material; a second electronic component disposed on the first wiring layer and connected to the first electronic component by the first wiring layer; and a second insulating material covering at least a portion of the second electronic component, wherein the at least a portion of the first electronic component is exposed from the other surface of the first insulating material, opposite to the one surface of the first insulating material.

According to another aspect of the present disclosure, an electronic component embedded substrate includes a base substrate including an insulating body; a first electronic component and a second electronic component each embedded in the insulating body; a first wiring layer disposed between the first electronic component and the second electronic component and connected to an electrode of the first electronic component; and a connection conductor made of a material different from the first wiring layer, and being in contact with an electrode of the second electronic component and the first wiring layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
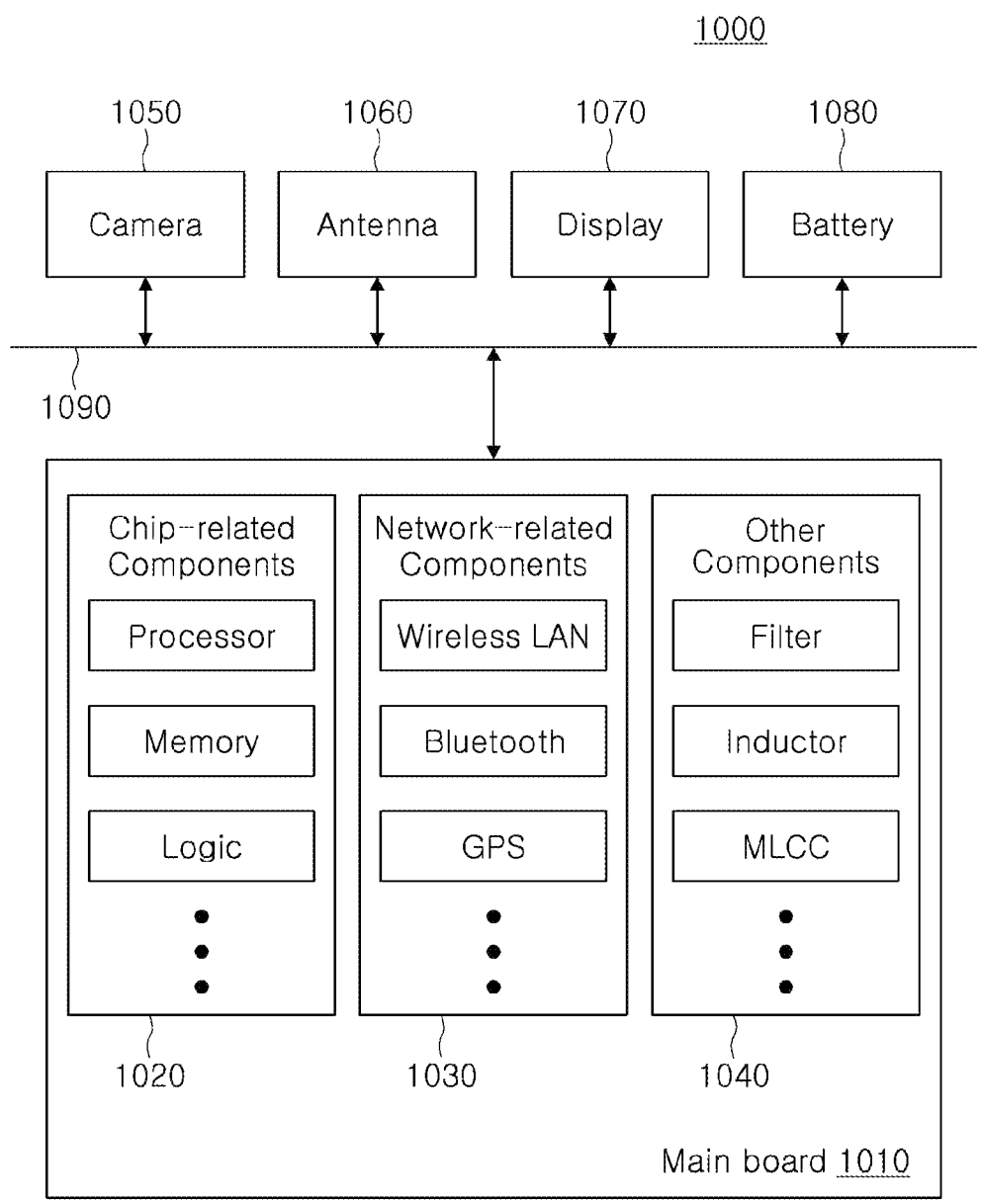
FIG. 1 is an example of a block diagram schematically illustrating an electronic device system according to an example.

Hereinafter, the present disclosure will be described with reference to the accompanying drawings. Shape and size of the elements in the drawings may be exaggerated or reduced for more clear description.

Electronic Device

FIG. 1 is an example of a block diagram schematically illustrating an electronic device system according to an example.

Referring to the drawings, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, and may also include other types of chip related components. In addition, the chip related components 1020 may be combined with each other. The chip related component 1020 may be in the form of a package including the above-described chip or an electronic component.

The network related components 1030 may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
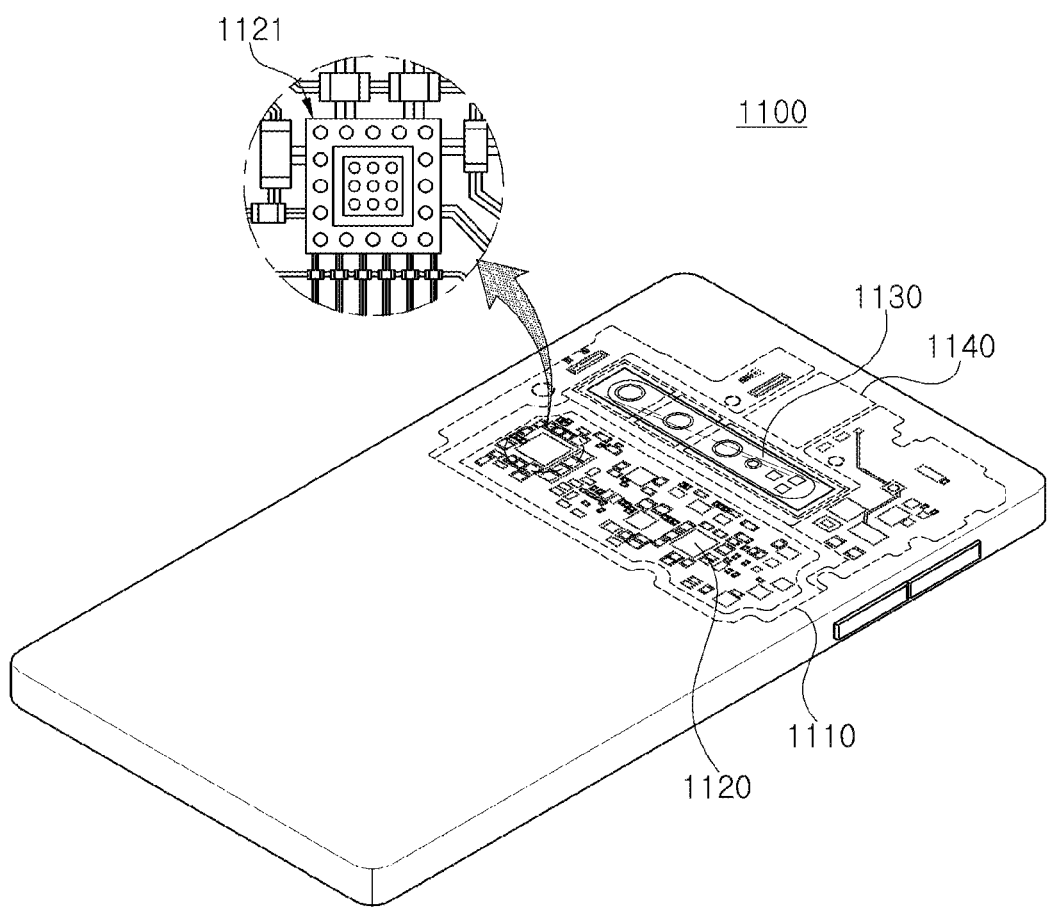
FIG. 2 is a perspective view schematically illustrating an electronic device according to an example.

FIG. 2 is a perspective view schematically illustrating an electronic device according to an example.

Referring to the drawings, an electronic device may be, for example, a smartphone 1100. A main board 1110 may be accommodated in the smartphone 1100, and various electronic components 1120 may be physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, a semiconductor package 1121, but are not limited thereto. The semiconductor package 1121 may be a surface in which a semiconductor chip or a passive component is mounted on a package substrate in a package substrate form, but is not limited thereto. The electronic device is not necessarily limited to the smartphone 1100, but may be other electronic devices as described above.

Electronic Component Embedded Substrate

Figure 3:
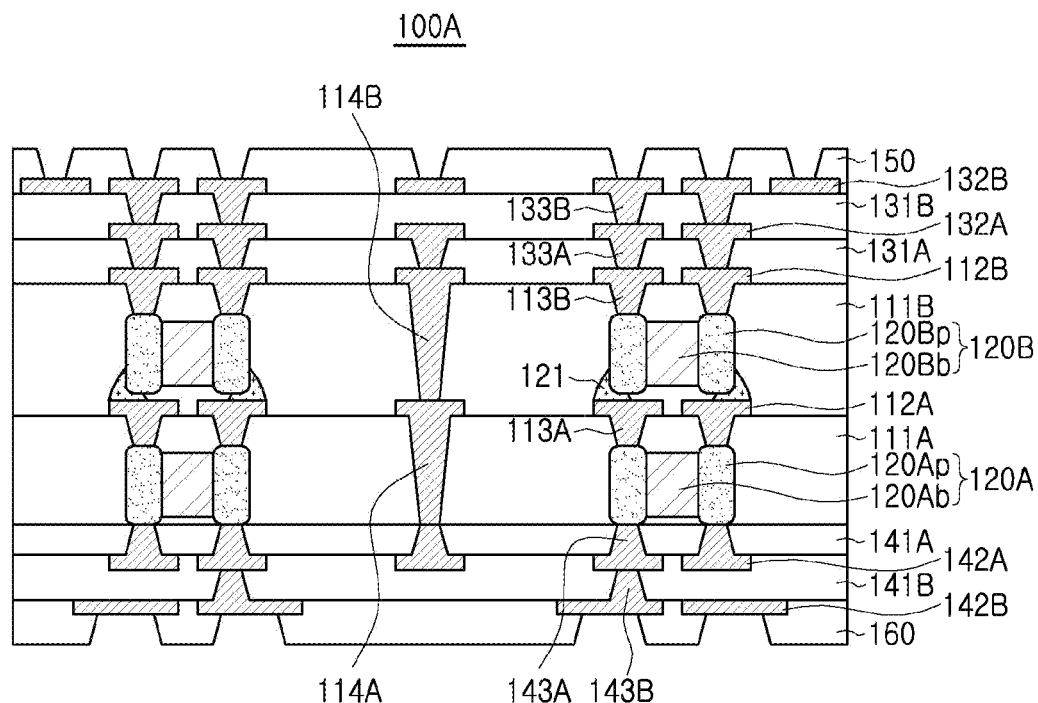
FIG. 3 is a cross-sectional view schematically illustrating an electronic component embedded substrate 100A according to an example.

FIG. 3 is a cross-sectional view schematically illustrating an electronic component embedded substrate 100A according to an example.

Referring to FIG. 3, an electronic component embedded substrate 100A according to an example may include a base substrate 110, an electronic component 120 embedded in the base substrate 110, a first build-up structure 130 and a second build-up structure 140 disposed on both sides of the base substrate 110, respectively, a first passivation layer 150 disposed on the first build-up structure 130, and a second passivation layer 160 disposed on the second build-up structure 140. As necessary, an electrical connection metal (not illustrated) disposed in each of openings of the first passivation layer 150 and the second passivation layer 160 may be further included.

In the present specification, "disposed on" a component may refer to being disposed on an upper side or on an upper surface of the component, but is not limited to a direction thereof. In some cases, it may refer to being disposed on a lower side or on a lower surface of the component.

The base substrate 110 may be a region in which the electronic component 120 is embedded, and may include a first insulating material 111A, a first wiring layer 112A disposed on the first insulating material 111A, a first via 113A passing through the first insulating material 111A and connecting the first wiring layer 112A and a first electronic component 120A, a first through-via 114A passing through the first insulating material 111A and connecting the first wiring layer 112A and a first wiring layer 142A included in the second build-up structure 140, a second insulating material 111B disposed on the first insulating material 111A and covering the first wiring layer 112A, a second wiring layer 112B disposed on the second insulating material 111B, a second via 113B passing through the second insulating material 111B and connecting the second wiring layer 112B and a second electronic component 120B, and a second through-via 114B passing through the second insulating material 111B and connecting the first wiring layer 112A and the second wiring layer 112B.

The first electronic component 120A may be covered with the first insulating material 111A, and at least a portion of the first electronic component 120A may be exposed from the other surface of the first insulating material 111A, opposite to one surface on which the second insulating material 111B is disposed. In this case, the exposed portion of the first electronic component 120A may be an electrode 120Ap. Therefore, a surface to which the electrode 120Ap of the first electronic component 120A is exposed from the other surface of the first insulating material 111A may be substantially coplanar with the other surface of the first insulating material 111A. A body 120Ab of the first electronic component may be embedded in the first insulating material 111A. Therefore, the first electronic component 120A may be connected to the first wiring layer 142A through a first via 143A of the second build-up structure 140.

The second electronic component 120B may be mounted on the first wiring layer 112A by a surface mount technology (SMT). In this case, the second electronic component 120B may be mounted on the first wiring layer 112A through a connection conductor 121.

The first electronic component 120A and the second electronic component 120B may be connected to each other through the first via 113A and the first wiring layer 112A. In this case, as described below, the first electronic component 120A and the second electronic component 120B may be connected in parallel. The first via 113A and the first wiring layer 112Amay be arranged at a level between the first electronic component 120A and the second electronic component 120B, such that the first electronic component 120A and the second electronic layer 120B may be directly connected to each other without any other wiring layer.

The first electronic component 120A and the second electronic component 120B may be arranged in a thickness direction of each of the first electronic component 120A and the second electronic component 120B. On a plane, the first electronic component 120A and the second electronic component 120B may be arranged to overlap each other in the thickness direction of each of the first electronic component 120A and the second electronic component 120B.

As illustrated in the drawings, each of the first electronic component 120A and the second electronic component 120B may be provided as a plurality of electronic components. In this case, each of the plurality of first electronic components 120A may be spaced apart from each other by a predetermined distance. In addition, a space between each of the plurality of first electronic components 120A may be filled with the first insulating material 111A such that each of the plurality of first electronic components 120A may be spaced apart from each other by the first insulating material 111A. In addition, the plurality of second electronic components 120B may also be disposed in the same or a similar manner as the plurality of first electronic components 120A described above.

The first electronic component 120A and the second electronic component 120B may be connected to a semiconductor package (not illustrated), or the like, mounted on the electronic component embedded substrate through wiring layers 132A and 132B included in the first build-up structure 130. Therefore, an electrical connection path between the first electronic component 120A and/or the second electronic component 120B and the semiconductor package (not illustrated) may be shortened. In addition, electrical signal loss and the like may be minimized.

In general, in order to shorten a signal path with the semiconductor package (not illustrated) mounted on the electronic component embedded substrate, electronic components embedded in the substrate may be buried to be adjacent to one side on which the semiconductor package (not illustrated) is mounted to face the semiconductor package (not illustrated). In this case, since the substrate may have an asymmetrical structure due to a region in which the electronic component is disposed and a region in which the electronic component is not disposed, bending or warpage may occur. In the case of the electronic component embedded substrate 100A according to an example, the first electronic component 120A and the second electronic component 120B may be not buried to be adjacent to one side on which the semiconductor package (not illustrated) is mounted, and may be symmetrically buried in the base substrate 110 in the thickness direction. Therefore, the bending or warpage of the substrate may be improved.

As described below, the first electronic component 120A and the second electronic component 120B may be capacitors having an electrode 120Ap and 120Bp, respectively. In this case, the electrodes 120Ap and 120Bp of the first electronic component 120A and the second electronic component 120B may be connected to each other by the first via 113A and the first wiring layer 112A of the base substrate 110. In addition, the electrodes of each of the first electronic component 120A and the second electronic component 120B may be connected in parallel. In one example, a body 120Ab of the first electronic component 120A and a body 120Bb of the second electronic component 120B may be embedded in the first and second insulating materials 111A and 111B, respectively. Therefore, it is possible to have effects of increasing capacitance of the electronic component and/or decreasing the equivalent series inductance (ESL) of the electronic component, and it is possible to improve the power integrity (PI) characteristics.

Figure 16:
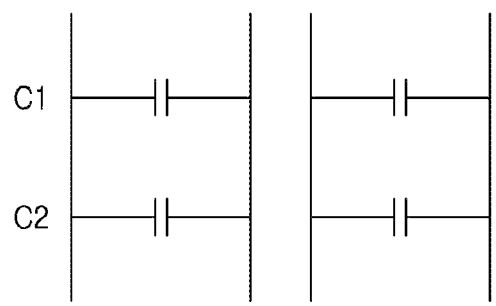
FIG. 16 schematically illustrates a circuit diagram between electronic components included in an electronic component embedded substrate 100A according to an example.

FIG. 16 schematically shows a circuit diagram of the first electronic component 120A and the second electronic component 120B included in the electronic component module 120. In this case, capacitance values of the first electronic component 120A and the second electronic component 120B may be denoted by C1 and C2, respectively. As illustrated in the drawings, as the first electronic component 120A and the second electronic component 120B are connected in parallel to each other, a value of the total capacitance may be increased to C1+C2. In this case, as illustrated in the drawings, each of the first electronic component 120A and the second electronic component 120B are illustrated to be provided as a plurality of electronic components.

The first build-up structure 130 may include a first insulating layer 131A, a first wiring layer 132A disposed on the first insulating layer 131A, a first via 133A passing through the first insulating layer 131A and connecting the first wiring layer 132A and a second wiring layer 112B of the base substrate 110, a second insulating layer 131B disposed on the first insulating layer 131A, a second wiring layer 132B disposed on the second insulating layer 131B, and a second via 133B passing through the second insulating layer 131B and connecting the second wiring layer 132B and the first wiring layer 132A.

The second build-up structure 140 may include a first insulating layer 141A, a first wiring layer 142A disposed on the first insulating layer 141A, a first via 143A passing through the first insulating layer 141A and connecting the first wiring layer 142A and the first electronic component 120A, a second insulating layer 141B disposed on the first insulating layer 141A, a second wiring layer 142B disposed on the second insulating layer 141B, and a second via 143B passing through the second insulating layer 141B and connecting the second wiring layer 142B and the first wiring layer 142A.

Hereinafter, each configuration of an electronic component embedded substrate 100A according to an example will be described in more detail.

As described above, the base substrate 110 may include the first insulating material 111A, the first wiring layer 112A disposed on the first insulating material 111A, the first via 113A passing through the first insulating material 111A and connecting the first wiring layer 112A and the first electronic component 120A, the first through-via 114A passing through the first insulating material 111A and connecting the first wiring layer 112A and the first wiring layer 142A included in the second build-up structure 140, the second insulating material 111B disposed on the first insulating material 111A and covering the first wiring layer 112A, the second wiring layer 112B disposed on the second insulating material 111B, the second via 113B passing through the second insulating material 111B and connecting the second wiring layer 112B and the second electronic component 120B, and the second through-via 114B passing through the second insulating material 111B and connecting the first wiring layer 112A and the second wiring layer 112B.

The structure of the base substrate 110 is not limited thereto, and may be changed within a range capable of being designed by those skilled in the art. For example, the number of insulating layers, wiring layers, and/or vias included in the base substrate 110 may be more or less than that illustrated in the drawings.

A material for forming each of the first insulating material 111A and the second insulating material 111B is not particularly limited, and any material may be used, as long as it has insulating properties. For example, a thermosetting resin such as an epoxy resin, a thermoplastic resin such as polyimide, or materials including reinforcements such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

The material for forming each of the first insulating material 111A and the second insulating material 111B may include the same kind of material, and may have substantially the same thickness as each other. However, the present disclosure is not limited thereto, and may include different kinds of materials, and may have different thicknesses from each other.

A boundary between the first insulating material 111A and the second insulating material 111B may not be distinguished from each other, depending on materials and processes of the first and second insulating materials 111A and 111B. For example, the first insulating material 111A and the second insulating material 111B may be integrated with each other, or the boundary therebetween may be unclear during a stacking process. Therefore, it may be difficult to visually determine the boundary of the electronic component embedded substrate, finally produced.

As a material for forming each of the first and second wiring layers 112A and 112B, a conductive material such as copper (Cu), aluminum (Al), silver (Ag), tin (Sn), gold (Au), nickel (Ni), lead (Pb), titanium (Ti), alloys thereof, or the like may be used. Each of the first and second wiring layers 112A and 112B may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

As a material for forming each of the first via 113A and the second via 113B, a conductive material such as copper (Cu), aluminum (Al), silver (Ag), tin (Sn), gold (Au), nickel (Ni), lead (Pb), titanium (Ti), alloys thereof, or the like may be used. Each of the first via 113A and the second via 113B may be entirely filled with a conductive material, or the conductive material may be formed along a wall of the via. When the via is that in which a conductive material is formed along a wall of a via hole, an insulating material may fill the via hole. In addition, a shape of each of the first via 113A and the second via 113B may be any shape known in the art, such as a tapered shape, a cylindrical shape, or the like.

The first via 113A may have a structure integrated with the first wiring pattern 112A connected to the first via 113A. The second via 113B may have a structure integrated with the second wiring pattern 112B connected to the second via 113B.

As a material for forming each of the first through-via 114A and the second through-via 114B, a conductive material such as copper (Cu), aluminum (Al), silver (Ag), tin (Sn), gold (Au), nickel (Ni), lead (Pb), titanium (Ti), alloys thereof, or the like may be used. Each of the first through-via 114A and the second through-via 114B may be entirely filled with a conductive material, or the conductive material may be formed along a wall of the via. When each of the first through-via 114A and the second through-via 114B is that in which a conductive material is formed along a wall of a via hole, an insulating material may fill the via hole. In addition, a shape of each of the first through-via 114A and the second through-via 114B may be applied to all shapes known in the art, such as a tapered shape, a cylindrical shape, or the like.

The first through-via 114A may have a structure integrated with the first wiring pattern 112A connected to the first through-via 114A. The second through-via 114B may have a structure integrated with the second wiring pattern 112B connected to the second through-via 114B.

The first through-via 114A may be connected to and in contact with the first via 143A of the second build-up structure 140. In this case, the first through-via 114A and the first via 143A may be in contact with each other at a boundary in which the first insulating material 111A and the first insulating layer 141A are in contact with each other. At a boundary in which the first through-via 114A and the first via 143A are in contact with each other, a width and/or a cross-sectional area of each of the first through-via 114A and the first via 143A may be different from each other. For example, as illustrated in the drawings, the width of the first through-via 114A may be wider than the width of the first via 143A at the boundary in which the first through-via 114A and the first via 143A are in contact with each other. Since the width of the first through-via 114A or the first via 143A may be widened, the first through-via 114A and the first via 143A may be efficiently aligned.

Each of the first electronic component 120A and the second electronic component 120B may be a capacitor of a chip type having electrodes. For example, the first electronic component 120A and the second electronic component 120B may be a multilayer ceramic capacitor (MLCC), but are not limited thereto. In addition, as described above, the electrodes of each of the first electronic component 120A and the second electronic component 120B may be connected in parallel. For example, each of the first electronic component 120A and the second electronic component 120B may include a first electrode and a second electrode. The first electrodes of each of the first electronic component 120A and the second electronic component 120B may be connected to each other, and the second electrodes of each of the first electronic component 120A and the second electronic component 120B may be connected to each other.

However, the present disclosure is not limited thereto, and each of the first electronic component 120A and the second electronic component 120B may be a passive component such as an inductor, and may be an active circuit such as an integrated circuit (IC), a semiconductor chip, or the like.

The connection conductor 121 may include a solder or a conductive paste. However, the present disclosure is not limited thereto, and any material for forming the connection conductor 121 may be used as long as it may be a conductive material.

As described above, the first build-up structure 130 may include the first insulating layer 131A, the first wiring layer 132A disposed on the first insulating layer 131A, the first via 133A passing through the first insulating layer 131A and connecting the first wiring layer 132A and the second wiring layer 112B of the base substrate 110, the second insulating layer 131B disposed on the first insulating layer 131A, the second wiring layer 132B disposed on the second insulating layer 131B, and the second via 133B passing through the second insulating layer 131B and connecting the second wiring layer 132B and the first wiring layer 132A.

The structure of the first build-up structure 130 is not limited thereto, and may be changed within a range capable of being designed by those skilled in the art. For example, the number of insulating layers, wiring layers, and/or vias included in the first build-up structure 130 may be more or less than that illustrated in the drawings.

A material for forming each of the first insulating layer 131A and the second insulating layer 131B is not particularly limited, and any material may be used as long as it has insulating properties. For example, a thermosetting resin such as an epoxy resin, a thermoplastic resin such as polyimide, or materials including reinforcements such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

A boundary between the first insulating layer 131A and the second insulating layer 131B may not be distinguished from each other, depending on materials and processes of the first and second insulating layers 131A and 131B. For example, the first insulating layer 131A and the second insulating layer 131B may be integrated with each other, or the boundary therebetween may be unclear during a stacking process. Therefore, it may be difficult to visually determine the boundary of the ultimately produced electronic component embedded substrate.

In addition, a boundary between the first insulating layer 131A and the second insulating material 111B contacting the same may not be distinguished from each other, depending on materials and processes of the first and second insulating layers 131A and 131B. For example, the first insulating layer 131A and the second insulating material 111B may be integrated with each other, or the boundary therebetween may be unclear during a stacking process. Therefore, it may be difficult to visually determine the boundary of the electronic component embedded substrate, finally produced.

As a material for forming each of the first wiring layer 132A and the second wiring layer 132B, a conductive material such as copper (Cu), aluminum (Al), silver (Ag), tin (Sn), gold (Au), nickel (Ni), lead (Pb), titanium (Ti), alloys thereof, or the like may be used. Each of the first wiring layer 132A and the second wiring layer 132B may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

As a material for forming each of the first via 133A and the second via 133B, a conductive material such as copper (Cu), aluminum (Al), silver (Ag), tin (Sn), gold (Au), nickel (Ni), lead (Pb), titanium (Ti), alloys thereof, or the like may be used. Each of the first via 133A and the second via 133B may be entirely filled with a conductive material, or the conductive material may be formed along a wall of the via. When the via is that in which a conductive material is formed along a wall of a via hole, an insulating material may fill the via hole. In addition, a shape of each of the first via 133A and the second via 133B may be any shape known in the art, such as a tapered shape, a cylindrical shape, or the like.

The first via 133A may have a structure integrated with the first wiring pattern 132A connected to the first via 133A. The second via 133B may have a structure integrated with the second wiring pattern 132B connected to the second via 133B.

As described above, the second build-up structure 140 may include the first insulating layer 141A, the first wiring layer 142A disposed on the first insulating layer 141A, the first via 143A passing through the first insulating layer 141A and connecting the first wiring layer 142A and the first electronic component 120A, the second insulating layer 141B disposed on the first insulating layer 141A, the second wiring layer 142B disposed on the second insulating layer 141B, and the second via 143B passing through the second insulating layer 141B and connecting the second wiring layer 142B and the first wiring layer 142A.

The structure of the second build-up structure 140 is not limited thereto, and may be changed within a range capable of being designed by those skilled in the art. For example, the number of insulating layers, wiring layers, and/or vias included in the second build-up structure 140 may be more or less than that illustrated in the drawings.

A material for forming each of the first insulating layer 141A and the second insulating layer 141B is not particularly limited, and any material may be used as long as it has insulating properties. For example, a thermosetting resin such as an epoxy resin, a thermoplastic resin such as polyimide, or materials including reinforcements such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

A boundary between the first insulating layer 141A and the second insulating layer 141B may not be distinguished from each other, depending on materials and processes of the first insulating layer 141A and the second insulating layer 141B. For example, the first insulating layer 141A and the second insulating layer 141B may be integrated with each other, or the boundary therebetween may be unclear during a stacking process. Therefore, it may be difficult to visually determine the boundary of the electronic component embedded substrate, finally produced.

In addition, a boundary between the first insulating layer 141A and the first insulating material 111A contacting the same may not be distinguished from each other, depending on materials and processes of the first insulating layer 141A and the first insulating material 111A. For example, the first insulating layer 141A and the first insulating material 111A may be integrated with each other, or the boundary therebetween may be unclear during a stacking process. Therefore, it may be difficult to visually determine the boundary of the electronic component embedded substrate, finally produced.

As a material for forming each of the first wiring layer 142A and the second wiring layer 142B, a conductive material such as copper (Cu), aluminum (Al), silver (Ag), tin (Sn), gold (Au), nickel (Ni), lead (Pb), titanium (Ti), alloys thereof, or the like may be used. Each of the first wiring layer 142A and the second wiring layer 142B may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

As a material for forming each of the first via 143A and the second via 143B, a conductive material such as copper (Cu), aluminum (Al), silver (Ag), tin (Sn), gold (Au), nickel (Ni), lead (Pb), titanium (Ti), alloys thereof, or the like may be used. Each of the first via 143A and the second via 143B may be entirely filled with a conductive material, or the conductive material may be formed along a wall of the via. When the via is that in which a conductive material is formed along a wall of a via hole, an insulating material may fill the via hole. In addition, a shape of each of the first via 143A and the second via 143B may be any shape known in the art, such as a tapered shape, a cylindrical shape, or the like.

The first via 143A may have a structure integrated with the first wiring pattern 142A connected to the first via 143A. The second via 143B may have a structure integrated with the second wiring pattern 142B connected to the second via 143B.

The first passivation layer 150 and the second passivation layer 160 may protect an internal structure of the electronic component embedded substrate 100A according to an example from physical or chemical damage, or the like externally. Each of the first passivation layer 150 and the second passivation layer 160 may include a thermosetting resin and an inorganic filler. For example, each of the first passivation layer 150 and the second passivation layer 160 may be ABF. The present disclosure is not limited thereto, and the first passivation layer 150 and the second passivation layer 160 may be a known photosensitive insulating layer, for example, a solder resist (SR) layer. The first passivation layer 150 and the second passivation layer 160 may include the same kind of material, and may have substantially the same thickness as each other. However, the present disclosure is not limited thereto, and may include different kinds of materials, and may have different thicknesses from each other.

The first passivation layer 150 may have one or more openings (not illustrated) that expose at least a portion of the wiring layer 132B of the first build-up structure 130. In addition, the second passivation layer 160 may have one or more openings (not illustrated) that expose at least a portion of the wiring layer 142B of the second build-up structure 140. In these cases, a surface treatment layer may be formed on each of the exposed wiring layers 132B and 142B. The surface treatment layer may be formed by, for example, a gold plating process, a tin plating process, a silver plating process, a nickel plating process, or the like. As necessary, the openings of each of the first passivation layer 150 and the second passivation layer 160 may be formed of a plurality of via holes.

FIGS. 4A to 8 schematically illustrate a manufacturing process of an electronic component embedded substrate 100A according to an example.

Figure 4A:
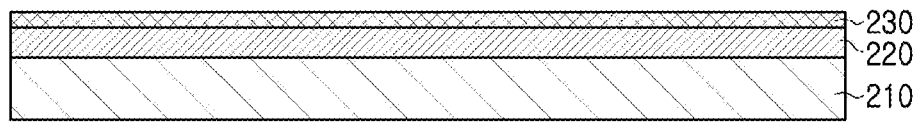
FIGS. 4A to 8 schematically illustrate a manufacturing process of an electronic component embedded substrate 100A according to an example.
Figure 4B:
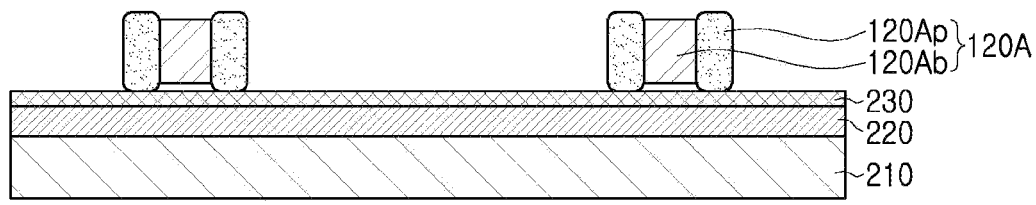
Figure 4C:
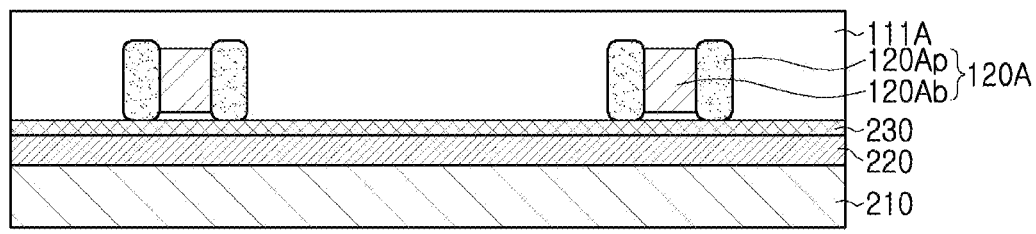

Referring to FIGS. 4A-4C, an adhesive member 230 may be attached on a carrier film 210 to which a metal layer 220 such as a copper foil and the like is attached, a first electronic component 120A may be disposed thereon, and the first electronic component 120A may be sealed with a first insulating material 111A.

The adhesive member 230 may be used, as long as it may fix the first electronic component 120A. For example, a well-known tape and the like may be used.

The first insulating material 111A may be formed by a known method. For example, the first insulating material 111A may be formed by a process including laminating precursors thereof by a known lamination process, and then curing the laminated precursors, may be formed by a process including applying precursors thereof, and then curing the applied precursors, or may be formed by other processes.

Figure 5A:
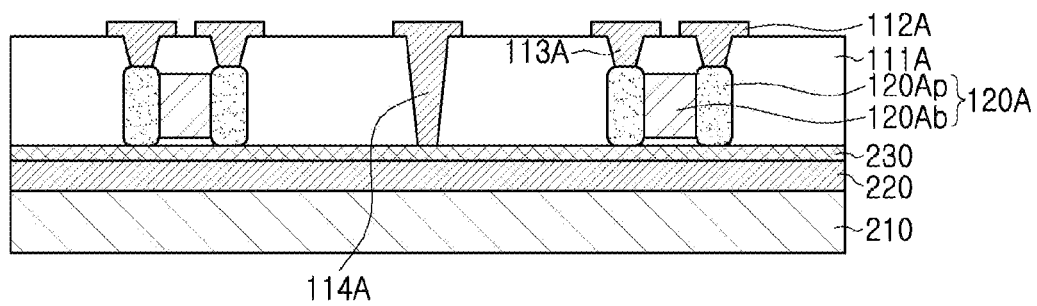
Figure 5B:
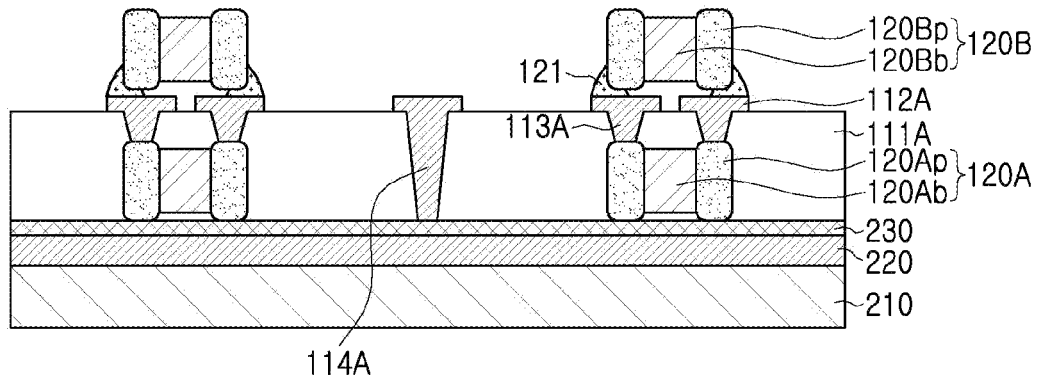
Figure 5C:
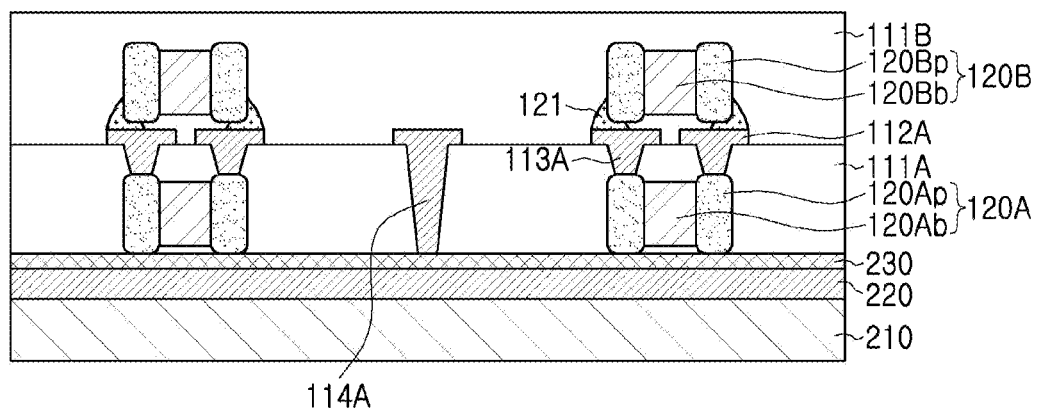

Referring to FIGS. 5A-5C, a first via 113A, a first through-via 114A, and a first wiring layer 112A may be formed. In addition, a second electronic component 120B may be disposed on the first wiring layer 112A through a connection conductor 121 such as solder, and the second electronic component 120B may be sealed with a second insulating material 111B.

The first via 113A, the first through-via 114A, and the first wiring layer 112A may be formed by a known method. For example, a photolithography, a mechanical drill, a laser drill, and/or the like may be used to form through-hole vias or via-holes, a dry film and the like may be used to form patterned spaces, and the through-hole vias or the via-holes and the patterned spaces may be filled by a plating process or the like, to form the first via 113A, the first through-via 114A, and the first wiring layer 112A.

The connection conductor 121 may be formed by a known method. For example, the connection conductor 121 may be formed by applying a solder or the like by a screen-printing process, a dispenser process, or the like, or may be formed by other processes.

Figure 6A:
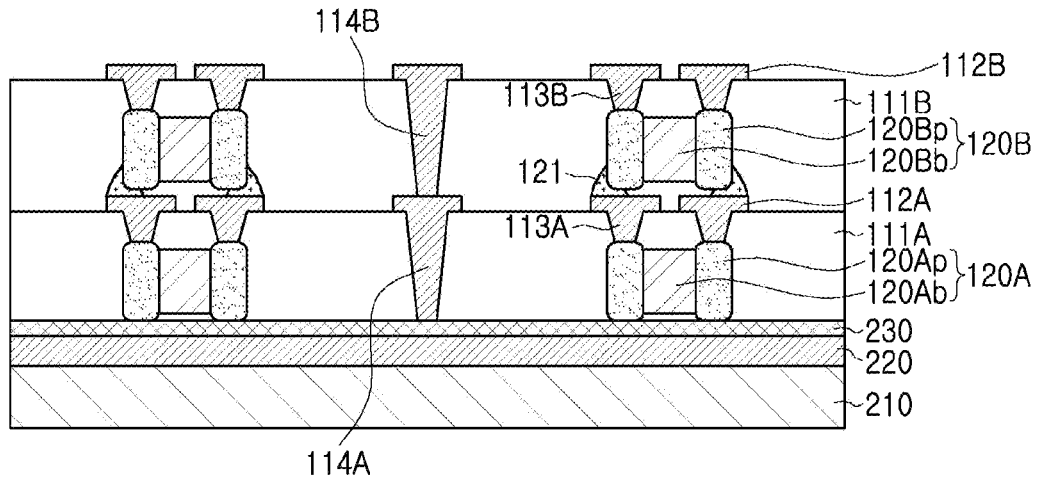
Figure 6B:
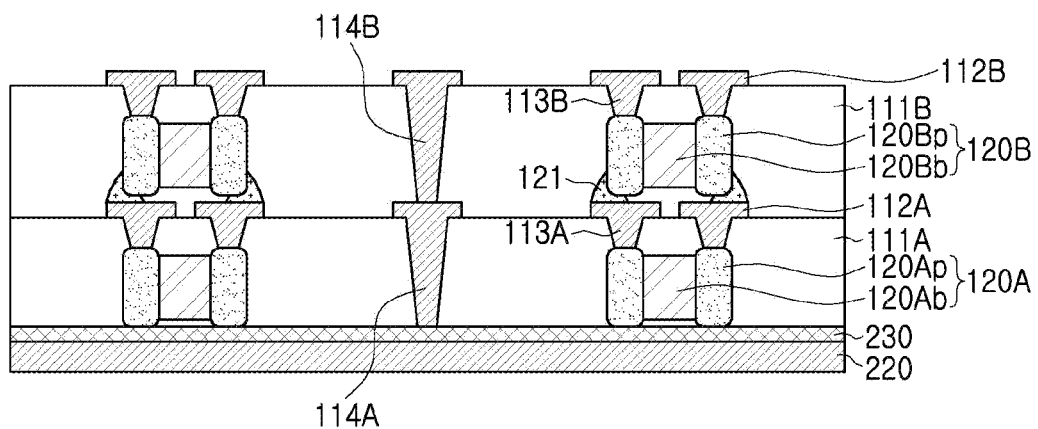
Figure 6C:
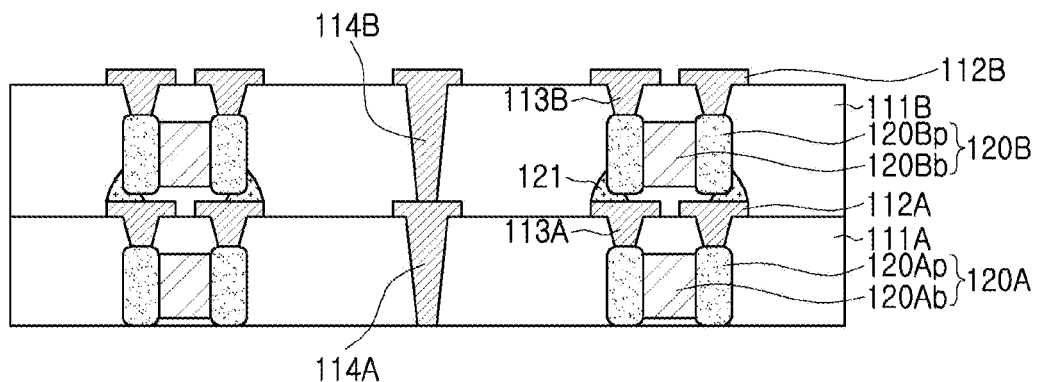

Referring to FIGS. 6A-6C, a second via 113B, a second through-via 114B, and a second wiring layer 112B may be formed. In addition, the carrier film 210, the metal layer 220, and the adhesive member 230 may be peeled off.

Figure 7A:
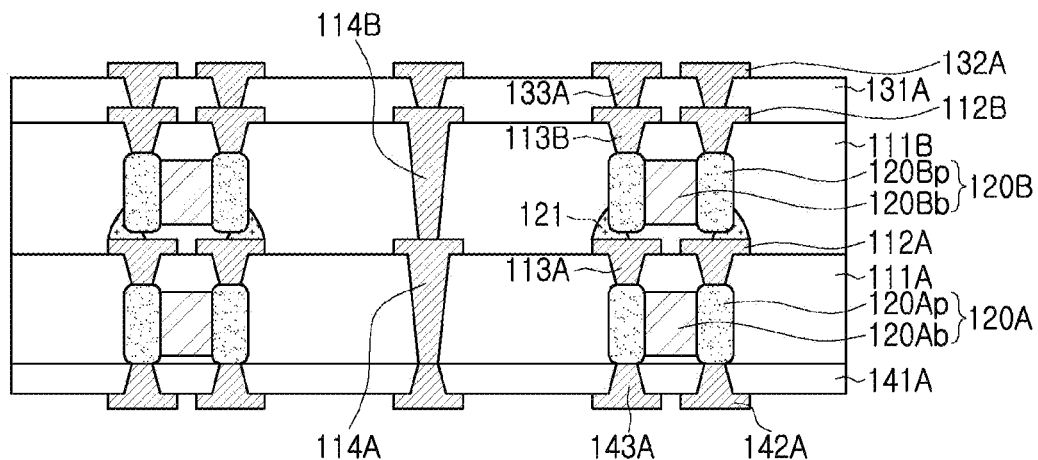
Figure 7B:
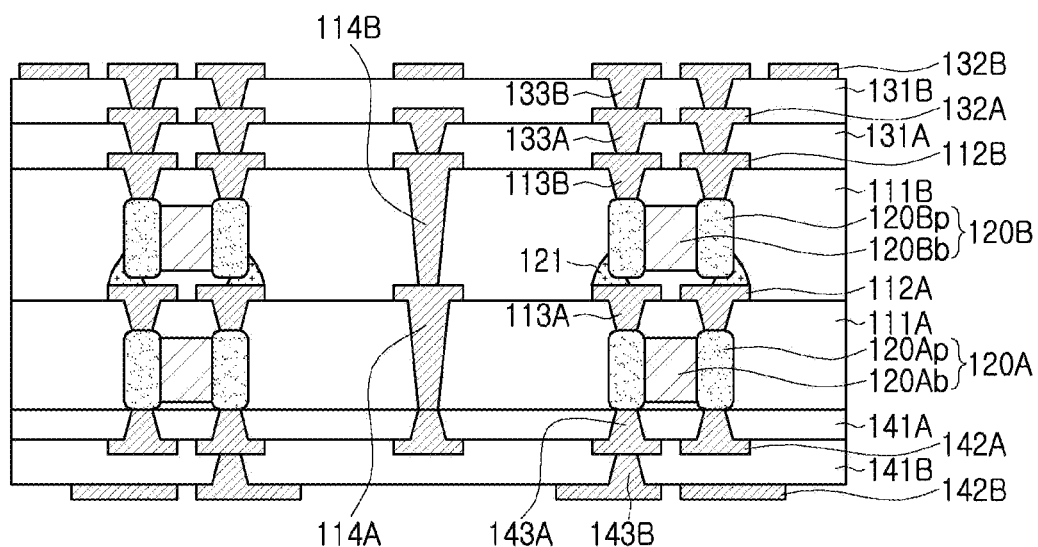

Referring to FIGS. 7A-7B, first insulating layers 131A and 141A, first vias 133A and 143A, and first wiring layers 132A and 142A of a first build-up structure 130 and a second build-up structure 140, respectively, may be formed. In addition, second insulating layers 131B and 141B, second vias 133B and 143B, and second wiring layers 132B and 142B of each of the first build-up structure 130 and the second build-up structure 140 may be formed. A method for forming the structures may be also as mentioned above.

Figure 8:
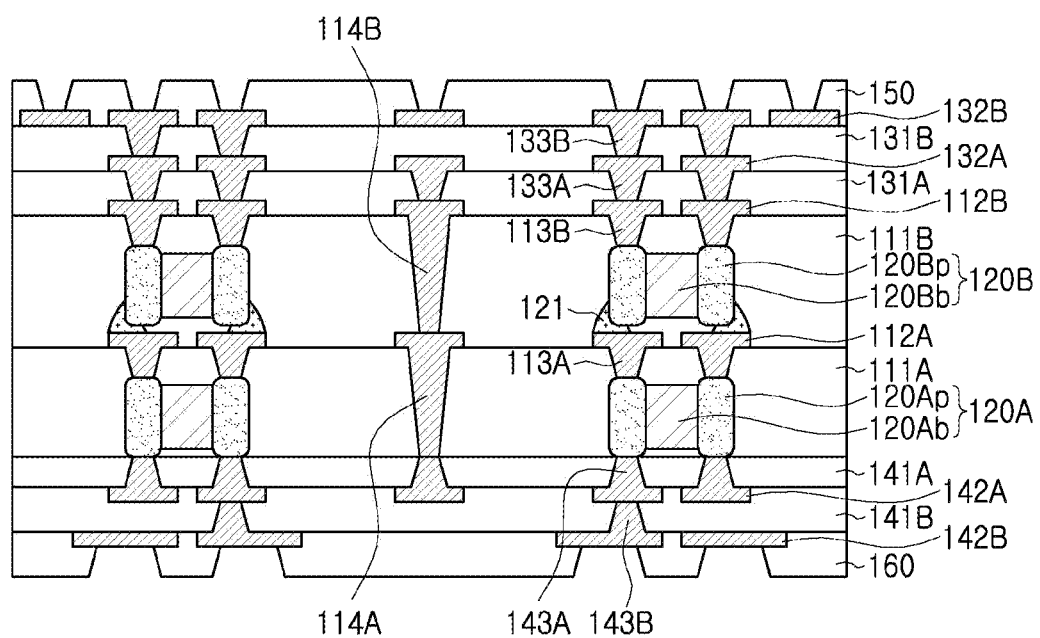

Referring to FIG. 8, a first passivation layer 150 and a second passivation layer 160 may be formed.

Each of the first passivation layer 150 and the second passivation layer 160 may also be formed by a known method, for example, may be formed by a process including laminating precursors of each of the first passivation layer 150 and the second passivation layer 160, and then curing the laminated precursors, may be formed by a process including applying materials for forming each of the first passivation layer 150 and the second passivation layer 160, and then curing the applied precursors, or may be formed by other processes.

Figure 9:
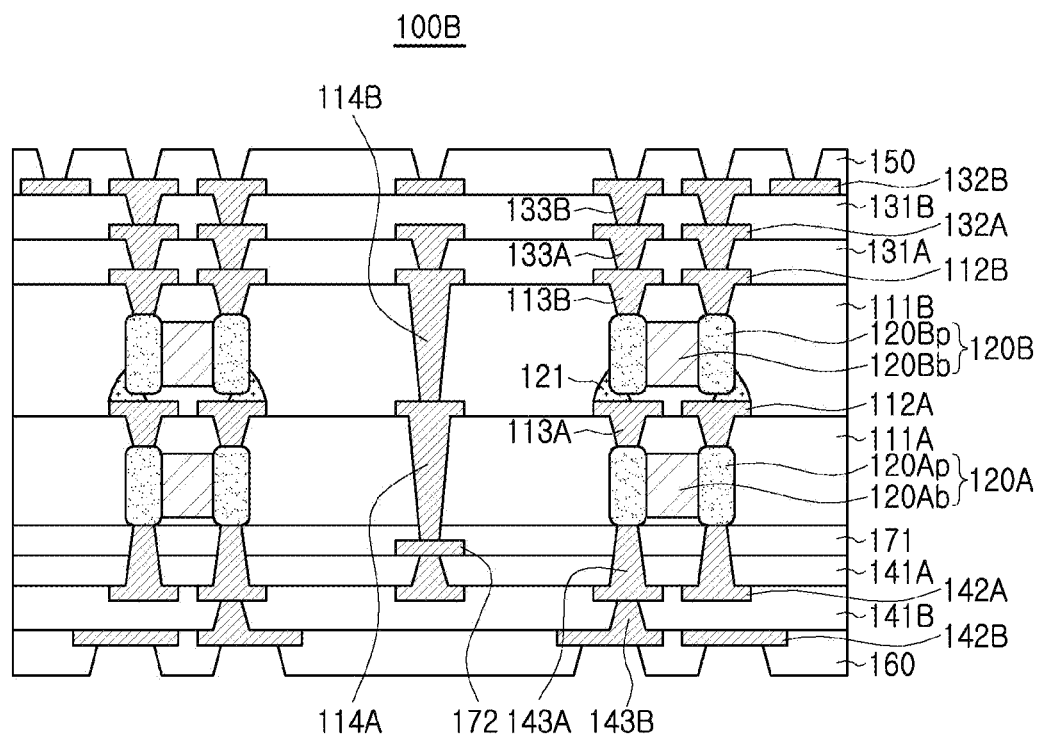
FIG. 9 is a cross-sectional view schematically illustrating an electronic component embedded substrate 100B according to another example.
Figure 10A:
FIGS. 10A to 14 schematically illustrate a manufacturing process of an electronic component embedded substrate 100B according to another example.
Figure 10B:
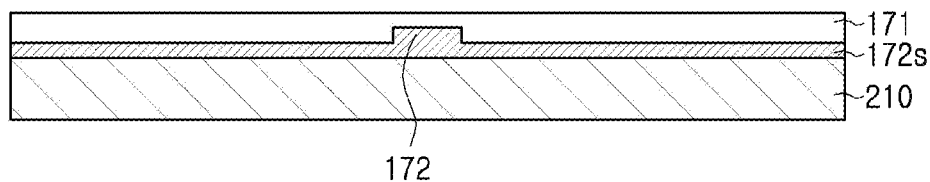
Figure 10C:
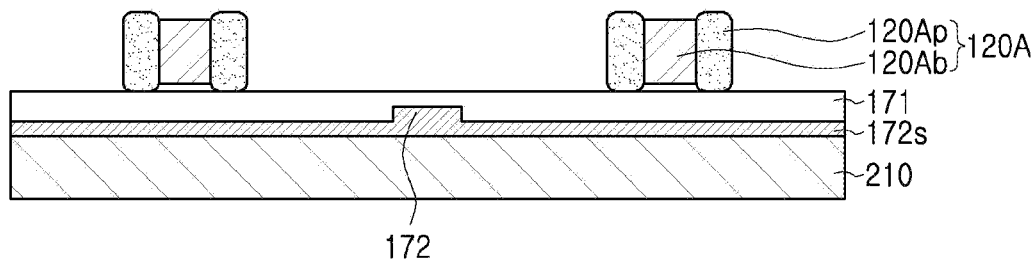
Figure 10D:
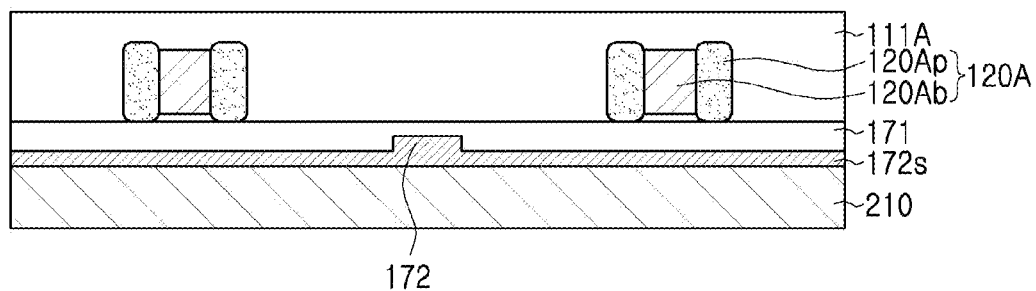
Figure 11A:
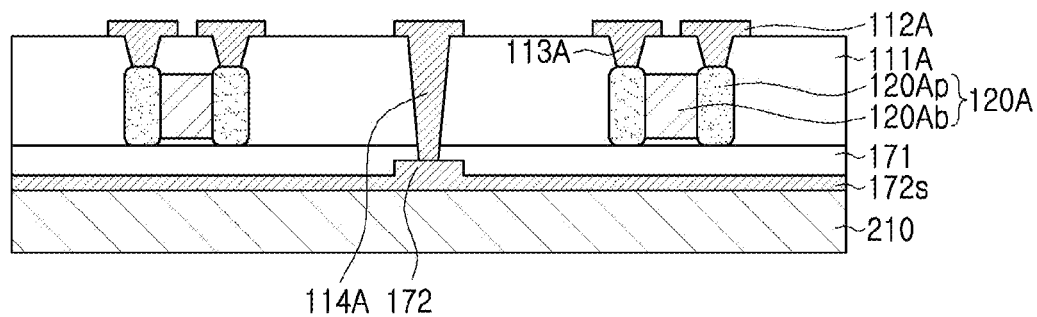
Figure 11B:
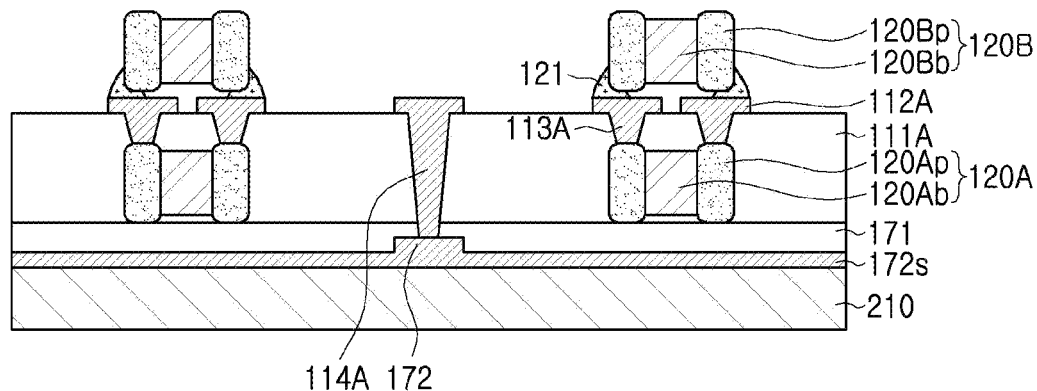
Figure 11C:
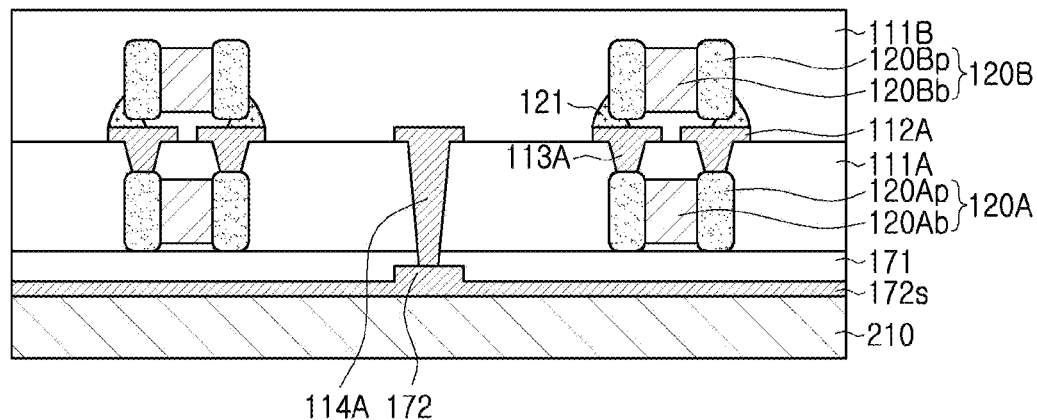

FIG. 9 is a cross-sectional view schematically illustrating an electronic component embedded substrate 100B according to another example.

The electronic component embedded substrate 100B according to another example may further include an adhesive member 171 and a wiring layer 172, compared to the electronic component embedded substrate 100A according to an example.

Therefore, the first through-via 114A may pass through the first insulating material 111A, may further pass through the adhesive member 171, and may be connected to the wiring layer 172. In addition, a portion of the first via 143A of the second build-up structure 140 may pass through the first wiring layer 141A, and may further pass through the adhesive member 171. Another portion of the first via 143A of the second build-up structure 140 may pass through the first wiring layer 141A, and may be connected to the wiring layer 172.

The adhesive member 171 may be disposed between the base substrate 110 and the second build-up structure 140, and the wiring layer 172 may be embedded in the adhesive member 171. In this case, one surface of the wiring layer 172 may be coplanar with a surface of the adhesive member 171 on which the second build-up structure 140 is disposed. Therefore, the one surface of the wiring layer 172 may be exposed from the adhesive member 171.

A material for forming the adhesive member 171 may be used without limitation, as long as the material has insulating properties and adhesive properties. For example, the adhesive member 171 may include a thermosetting resin and/or a thermoplastic resin.

As a material for forming the wiring layer 172, a conductive material such as copper (Cu), aluminum (Al), silver (Ag), tin (Sn), gold (Au), nickel (Ni), lead (Pb), titanium (Ti), alloys thereof, or the like may be used. The wiring layer 172 may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

Since the others may be substantially the same as those described in the electronic component embedded substrate 100A according to an example, detailed descriptions thereof will be omitted.

FIGS. 10A to 14 schematically illustrate a manufacturing process of an electronic component embedded substrate 100B according to another example.

Referring to FIGS. 10A-10D, a carrier layer 210 to which a metal layer 172c is attached may be patterned to form a wiring layer 172. In this case, only a seed layer 172s may remain in a portion in which the wiring layer 172 is not required. In addition, an adhesive member 171 may be formed on the wiring layer 172.

The wiring layer 172 may be formed by a well-known method. For example, a sputtering process, a subtractive process, an additive process, a semi additive process (SAP), a modified semi additive process (MSAP), or the like may be used.

Figure 12A:
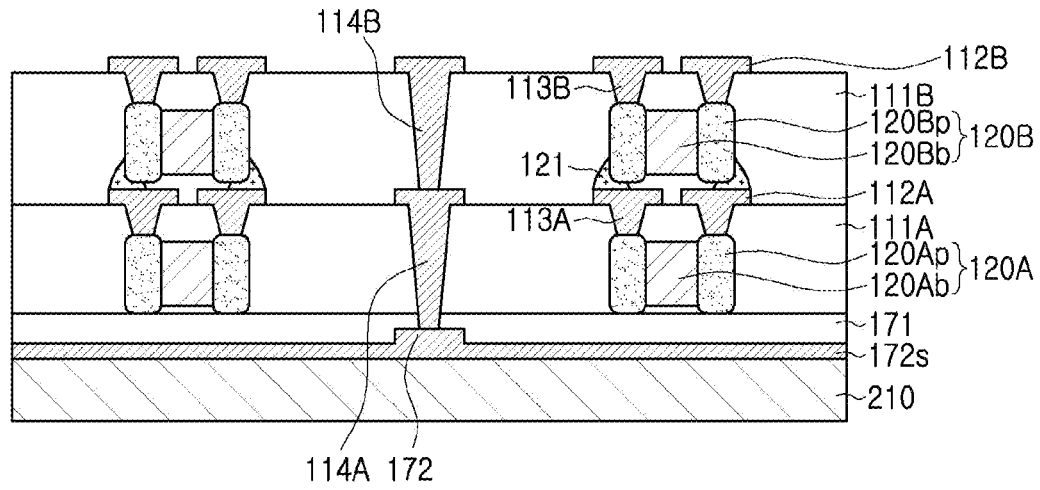
Figure 12B:
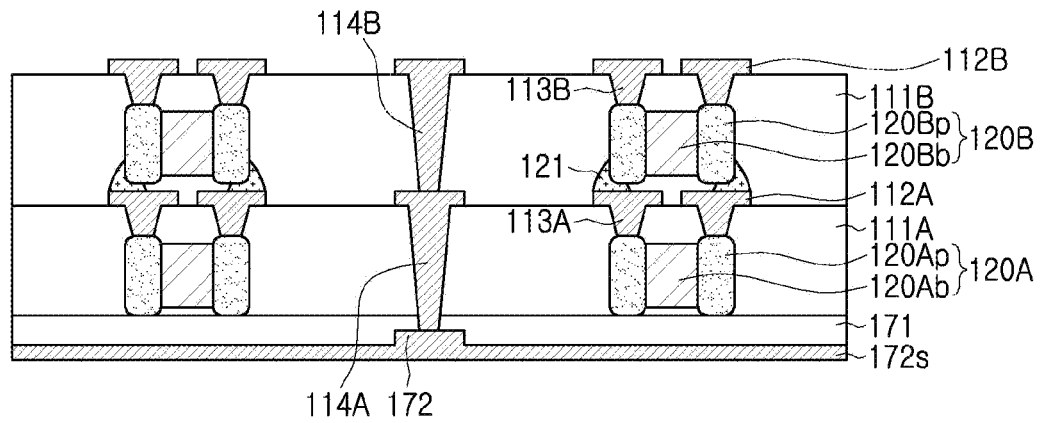
Figure 12C:
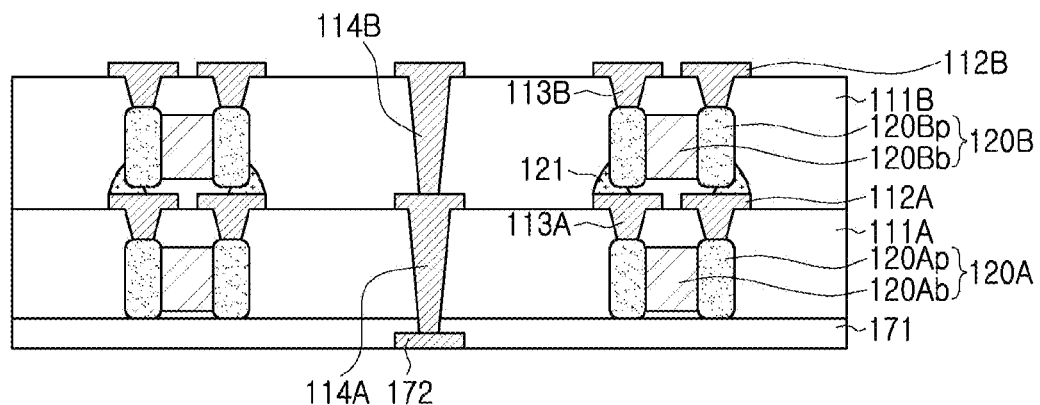

Referring to FIGS. 12A-12C, only the seed layer 172s may be peeled off by peeling the carrier film 210 by an etching process or the like. Therefore, the adhesive member 171 and the wiring layer 172 may be not removed.

Figure 13A:
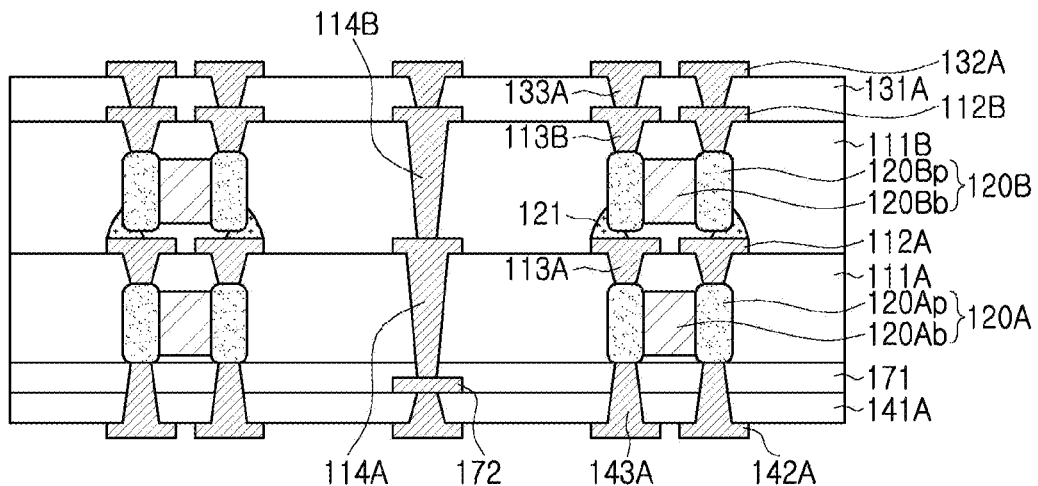
Figure 13B:
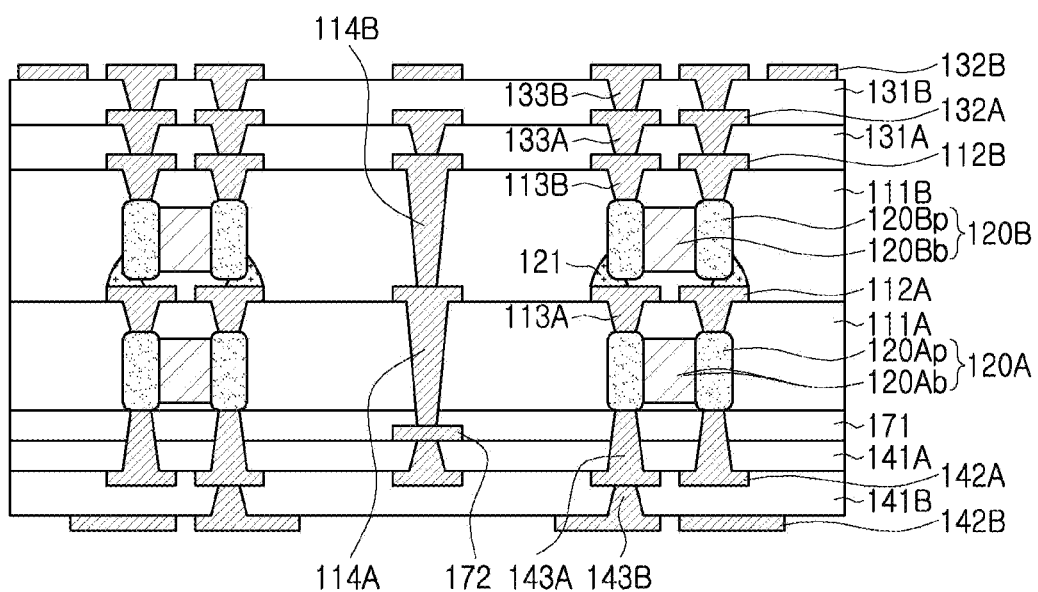
Figure 14:
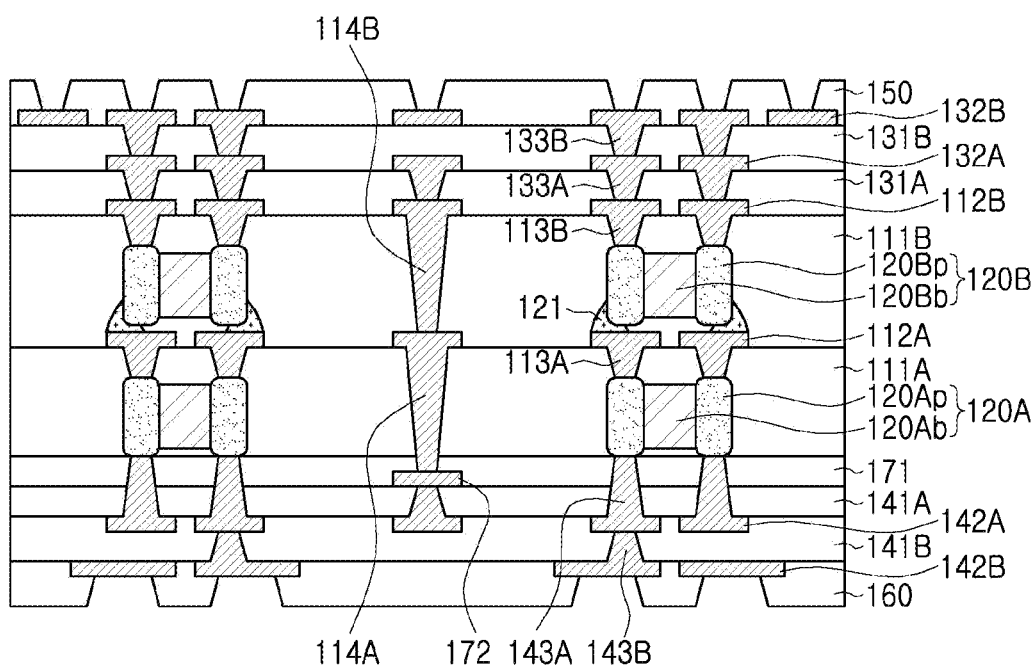

Since the others, illustrated in FIGS. 13A-14, may be substantially the same as those described in the electronic component embedded substrate 100A according to an example, detailed descriptions thereof will be omitted.

Figure 15:
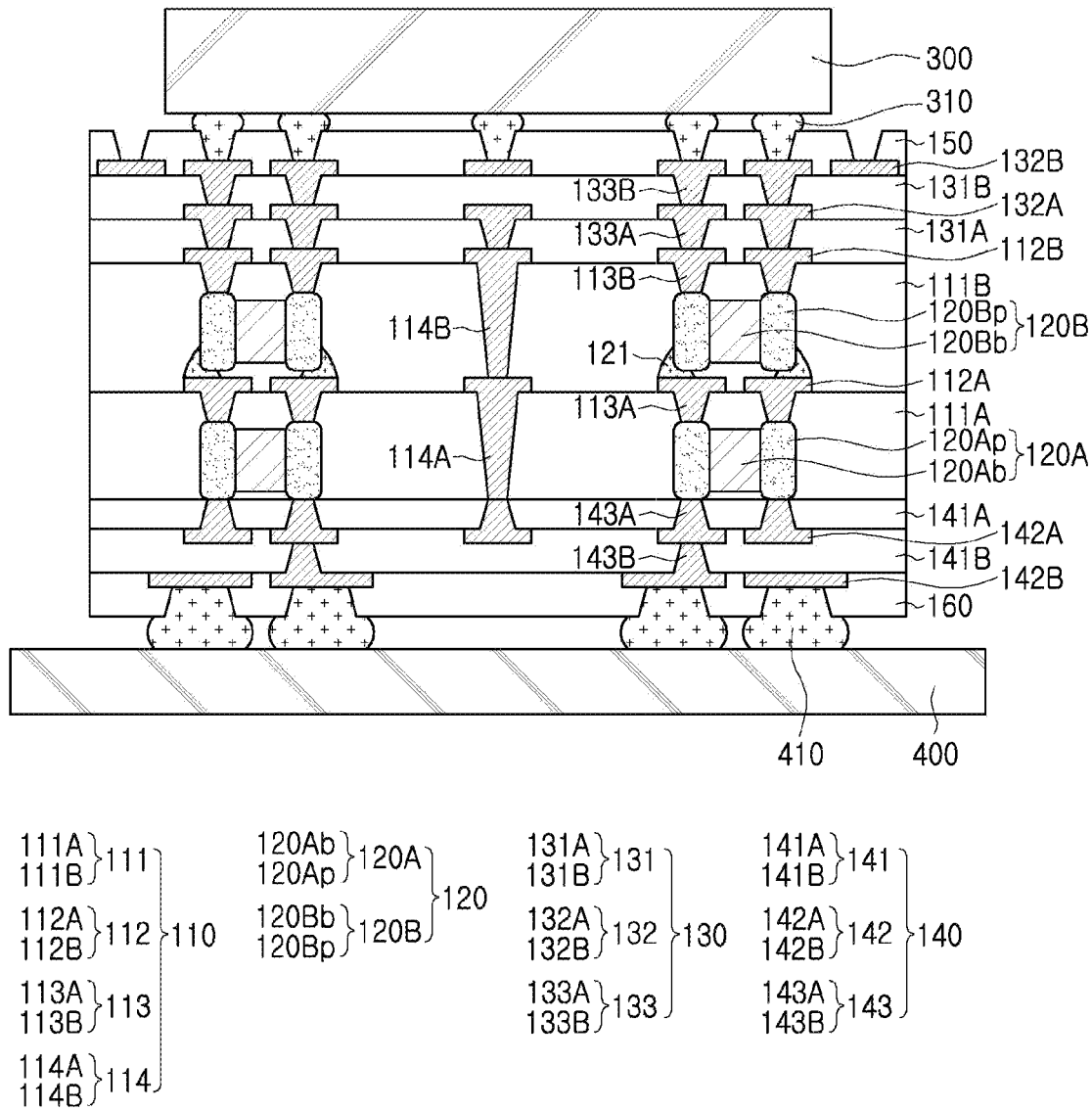
FIG. 15 is a cross-sectional view schematically illustrating an example in which a semiconductor package is mounted on an electronic component embedded substrate 100A according to an example.

FIG. 15 is a cross-sectional view schematically illustrating an example in which a semiconductor package is mounted on an electronic component embedded substrate 100A according to an example.

Referring to the drawings, when the above-described electronic component embedded substrate 100A according to an example of the present disclosure is used, a semiconductor package 300 may be mounted on the electronic component embedded substrate through an electrical connection metal 310. In this case, the embedded electronic component 120 may be electrically connected to a semiconductor chip (not illustrated) included in the semiconductor package 300 by a relatively short electrical path.

In addition, the semiconductor package 300 may be a package in which the semiconductor chip (not illustrated) is mounted on a separate interposer substrate, but is not limited thereto.

The semiconductor chip (not illustrated) may be an application specific integrated circuit (ASIC) and/or a high bandwidth memory (HBM), but is not limited thereto.

The electrical connection metal 310 may include a low melting metal, for example, tin (Sn), or an alloy containing tin (Sn). More specifically, the electrical connection metal 310 may be formed of solder or the like, but is only illustrative and a material thereof is not particularly limited thereto.

In addition, the electrical connection metal 310 may be fixed with an under-fill resin, as necessary.

The electronic component embedded substrate may be mounted on a substrate 400 such as a main board through a separate electrical connection metal 410.

The term of "connect" or "connection" in the present specification may be not only a direct connection, but also a concept including an indirect connection through an adhesive layer or the like. In addition, the term "electrically connected" or "electrical connection" in the present specification is a concept including both a physical connection and a physical non-connection. Also, the expressions of "first," "second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same example to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

As one of several effects of the present disclosure, an electronic component embedded substrate having shortened electrical connection paths may be provided.

As another effect among various effects of the present disclosure, an electronic component embedded substrate having improved power integrity (PI) characteristics due to an increase in capacitance of an electronic component and/or a decrease in equivalent series inductance (ESL) of the electronic component may be provided.

As another effect among various effects of the present disclosure, an electronic component embedded substrate having improved warpage characteristics may be provided.

While examples have been illustrated and described above, it will be apparent to those skilled in the art that modifications and variations could be made without departing from the scope of the present disclosure as defined by the appended claims.

What is claimed is:

1. An electronic component embedded substrate comprising:
   a first electronic component;
   a first insulating material covering at least a portion of the first electronic component;
   a first wiring layer disposed on one surface of the first insulating material;
   a second electronic component disposed on the first wiring layer and connected to the first electronic component by the first wiring layer; and
   a second insulating material, in which the second electronic component is embedded,
   wherein at least a portion of the first electronic component is exposed from the other surface of the first insulating material, opposite to the one surface of the first insulating material, and
   the second electronic component is disposed on the first wiring layer through a connection conductor, and
   the second insulating material is in direct contact with the connection conductor.

2. The electronic component embedded substrate according to claim 1, wherein the connection conductor comprises a solder or a conductive paste.

3. The electronic component embedded substrate according to claim 1, wherein the second electronic component is disposed to overlap the first electronic component on a plane.

4. The electronic component embedded substrate according to claim 1, wherein the first wiring layer is disposed at a level between the first electronic component and the second electronic component.

5. The electronic component embedded substrate according to claim 1, further comprising a first via passing through the first insulating material and connecting the first electronic component and the first wiring layer.

6. The electronic component embedded substrate according to claim 1, wherein each of the first electronic component and the second electronic component is a capacitor having an electrode,
   wherein the electrode of the first electronic component is connected to the electrode of the second electronic component in parallel.

7. The electronic component embedded substrate according to claim 6, wherein the electrodes of each of the first electronic component and the second electronic component comprise a first electrode and a second electrode, respectively,
   wherein the first electrode of the first electronic component is connected to the first electrode of the second electronic component, and
   the second electrode of the first electronic component is connected to the second electrode of the second electronic component.

8. The electronic component embedded substrate according to claim 6, wherein a surface in which the electrode of the first electronic component is exposed from the other surface of the first insulating material is coplanar with the other surface of the first insulating material.

9. The electronic component embedded substrate according to claim 1, further comprising a second wiring layer disposed on the second insulating material and connected to the second electronic component.

10. The electronic component embedded substrate according to claim 1, further comprising:
    a first build-up structure disposed on the first insulating material and including a first insulating layer and a second wiring layer connected to the first electronic component; and
    a second build-up structure disposed on the second insulating material and including a second insulating layer and a third wiring layer connected to the second electronic component.

11. The electronic component embedded substrate according to claim 10, further comprising an adhesive member disposed between the first insulating material and the first insulating layer; and
    a fourth wiring layer embedded in the adhesive member.

12. The electronic component embedded substrate according to claim 11, further comprising a first through-via passing through the first insulating material and the adhesive member and connecting the first wiring layer and the fourth wiring layer.

13. The electronic component embedded substrate according to claim 10, further comprising a first through-via passing through the first insulating material and connected to the first wiring layer,
    wherein the first build-up structure further comprises a via passing through the first insulating layer and connected to the second wiring layer,
    the first through-via and the via are in contact with each other at a boundary between the first insulating material and the first insulating layer, and
    a width of the first through-via is different from a width of the via, at the boundary with which the first through-via and the via are in contact.

14. The electronic component embedded substrate according to claim 1, wherein the first electronic component is provided as a plurality of first electronic components spaced apart from each other, and
    the second electronic component is provided as a plurality of second electronic components spaced apart from each other.

15. An electronic component embedded substrate comprising:
    a first electronic component;
    a first insulating material covering at least a portion of the first electronic component;
    a first wiring layer disposed on one surface of the first insulating material;
    a second electronic component disposed on the first wiring layer and connected to the first electronic component by the first wiring layer;
    a second insulating material covering at least a portion of the second electronic component;
    a first build-up structure disposed on the first insulating material and including a first insulating layer and a second wiring layer connected to the first electronic component;
    a second build-up structure disposed on the second insulating material and including a second insulating layer and a third wiring layer connected to the second electronic component; and
    a first through-via passing through the first insulating material and connected to the first wiring layer,
    wherein at least a portion of the first electronic component is exposed from the other surface of the first insulating material, opposite to the one surface of the first insulating material,
    the first build-up structure further comprises a via passing through the first insulating layer and connected to the second wiring layer, the first through-via and the via are in contact with each other at a boundary between the first insulating material and the first insulating layer, and a width of the first through-via is different from a width of the via, at the boundary with which the first through-via and the via are in contact.

16. An electronic component embedded substrate comprising:

a first electronic component;

a first insulating material covering at least a portion of the first electronic component;

a first wiring layer disposed on one surface of the first insulating material;

a second electronic component disposed on the first wiring layer and connected to the first electronic component by the first wiring layer;

a second insulating material, in which the second electronic component is embedded; and a connection conductor made of a material different from the first wiring layer, and being in contact with an electrode of the second electronic component and the first wiring layer, wherein the second insulating material is in direct contact with the connection conductor.

17. The electronic component embedded substrate according to claim 16, wherein the first electronic component is spaced apart from the material of the connection conductor.

18. The electronic component embedded substrate according to claim 17, wherein the connection conductor includes a solder or a conductive paste.

19. The electronic component embedded substrate according to claim 16, further comprising a first build-up structure and a second build-up structure disposed below and above the first and second electronic components, respectively, such that the first and second electronic components are disposed between the first and second build-up structures, wherein the electrode of the first electronic component is connected to the first wiring layer through a first via embedded in the first insulating material, the electrode of the first electronic component is exposed from the first insulating material and is connected to a second wiring layer embedded in the first build-up structure through a second via, and the electrode of the second electronic component is connected to a third wiring layer embedded in the second build-up structure through a third via.

20. The electronic component embedded substrate according to claim 19, wherein the second via has a tapered shape tapered in a direction opposite to a tapered direction of a tapered shape of each of the first and third vias.

* * * * *